(12) United States Patent
Kang (10) Patent No.: US 10,546,974 B2
(45) Date of Patent: Jan. 28, 2020

(54) LIGHT-EMITTING DEVICE

(71) Applicant: LG INNOTEK CO., LTD., Seoul (KR)

(72) Inventor: Hyun Oh Kang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 95 days.

(21) Appl. No.: 14/908,462

(22) PCT Filed: Jul. 18, 2014

(86) PCT No.: PCT/KR2014/006520
§ 371 (c)(1),
(2) Date: Jan. 28, 2016

(87) PCT Pub. No.: WO2015/016515
PCT Pub. Date: Feb. 5, 2015

(65) Prior Publication Data
US 2016/0190391 A1 Jun. 30, 2016

(30) Foreign Application Priority Data
Jul. 29, 2013 (KR) .......................... 10-2013-0089585

(51) Int. Cl.
*H01L 33/32* (2010.01)
*H01L 33/06* (2010.01)

(52) U.S. Cl.
CPC .............. *H01L 33/32* (2013.01); *H01L 33/06* (2013.01)

(58) Field of Classification Search
CPC ....... H01L 33/32; H01L 33/06; H01L 33/002; H01L 33/0025; H01L 33/644;
(Continued)

(56) References Cited

U.S. PATENT DOCUMENTS

2005/0093002 A1 5/2005 Tsai et al.
2005/0277218 A1 12/2005 Nakajo et al.
(Continued)

FOREIGN PATENT DOCUMENTS

CN 101221984 A 7/2008
CN 101388337 A 7/2008
(Continued)

OTHER PUBLICATIONS

Pela et al., "Accurate band gaps of AlGaN, InGaN, and AlInN alloys calculations based on LDA-1/2 approach", App. Phys. Lett., vol. 98, 15, © 2011, pp. 151907.*

*Primary Examiner* — Stephen W Smoot
*Assistant Examiner* — Sun Mi Kim King
(74) *Attorney, Agent, or Firm* — Birch, Stewart, Kolasch & Birch, LLP (57) ABSTRACT

Disclosed are a light-emitting device, a method of fabricating the same, a light-emitting device package, and a lighting system. The light-emitting device includes a first-conductivity-type semiconductor layer, an active layer disposed on the first-conductivity-type semiconductor layer and including a quantum well having a composition of $In_xGa_{1-x}N$ (0<x<1) and a quantum barrier having a composition of $In_yGa_{1-y}N$ (0≤y<1), and a second-conductivity-type semiconductor layer disposed on the active layer. The active layer includes a first quantum well disposed on the first-conductivity-type semiconductor layer, a first quantum barrier disposed on the first quantum well, a second quantum well disposed on the first quantum barrier, and a second quantum barrier disposed on the second quantum well. A concentration of indium (In) in the first quantum barrier gradually increases toward the second quantum well, and the maximum concentration of indium (In) in the first quantum
(Continued)

barrier is lower than a concentration of indium (In) in the second quantum well.

8 Claims, 10 Drawing Sheets

(58) Field of Classification Search
CPC .......... H01L 33/382–387; H01L 33/20; H01L 33/24; H01S 5/3407; H01S 5/3408
See application file for complete search history.

(56) References Cited

U.S. PATENT DOCUMENTS

| | | |
|---|---|---|
| 2006/0091404 A1 | 5/2006 | Shen et al. |
| 2009/0168825 A1* | 7/2009 | Koda ................ H01S 5/18311 372/45.01 |
| 2011/0121259 A1* | 5/2011 | Han ..................... H01L 33/06 257/13 |
| 2011/0133243 A1 | 6/2011 | Song |
| 2011/0187294 A1 | 8/2011 | Bergmann et al. |
| 2012/0236891 A1* | 9/2012 | Johnson ................ B82Y 20/00 372/45.01 |
| 2013/0056747 A1 | 3/2013 | Lee et al. |
| 2013/0087761 A1* | 4/2013 | Kimura ................. H01L 33/12 257/13 |
| 2014/0346437 A1* | 11/2014 | Sim ....................... H01L 33/06 257/13 |

FOREIGN PATENT DOCUMENTS

| | | |
|---|---|---|
| EP | 1653522 A2 | 5/2006 |
| JP | 2005-277374 A | 10/2005 |
| KR | 10-2009-0102205 A | 9/2009 |
| KR | 10-2009-0115906 A | 11/2009 |
| KR | 10-2012-0019598 A | 3/2012 |
| KR | 10-1244583 B1 | 3/2013 |
| KR | 10-2013-0082130 A | 7/2013 |
| WO | WO 2011/097150 A1 | 8/2011 |

* cited by examiner

LIGHT-EMITTING DEVICE

CROSS REFERENCE TO RELATED APPLICATIONS

This application is the National Phase of PCT International Application No. PCT/KR2014/006520, filed on Jul. 18, 2014, which claims priority under 35 U.S.C. 119(a) to Patent Application No. 10-2013-0089585, filed in Republic of Korea on Jul. 29, 2013, all of which are hereby expressly incorporated by reference into the present application.

BACKGROUND

The embodiment relates to a light-emitting device, a method of manufacturing the same, a light-emitting device package, and a lighting system.

Light-emitting devices (LEDs) include p-n junction diodes having characteristics of converting electric energy into light energy. LEDs may be formed as compound semiconductors of group III and group V elements of the periodic table, and various colors can be represented by adjusting the compositional ratio of the compound semiconductors.

When a forward voltage is applied to an LED, electrons of an n layer are combined with holes of a p layer, and thereby energy corresponding to band-gap energy between a conduction band and a valance band is released. The energy is mainly realized in the form of heat or light, and the LED emits the energy in the form of light.

For example, nitride semiconductors exhibit excellent thermal stability and wide band-gap energy, and thus have been spotlighted in the field of optical devices and high-power electronic devices. In particular, blue, green, and UV light emitting devices employing the nitride semiconductors have already been commercialized and are being extensively used.

A horizontal LED is fabricated by forming a nitride semiconductor layer on a sapphire substrate and disposing two electrode layers on the nitride semiconductor layer.

A normal LED has an active structure including an InGaN quantum well and a GaN quantum barrier. Since a potential barrier is low in a boundary between the quantum well and the quantum barrier due to a difference in band-gap energy between InGaN and GaN, a carrier confinement function of injected electrons may be degraded and an electron overflow phenomenon may occur. Accordingly, the number of non-radiative carriers may increase and light-emitting efficiency may be abruptly reduced.

Meanwhile, when a current density gradually increases in an epitaxial structure in the presence of the electron overflow phenomenon, bending of a band-gap occurs. As a result, the electron overflow phenomenon may be more serious even in the InGaN quantum well having the same concentration of indium (In).

The electron overflow phenomenon generated in a quantum well having the low potential barrier may reduce the number of photons (hv) generated in a multiple quantum well (MQW) structure.

Meanwhile, the normal LED has another problem in that carrier transfer efficiency is low in the MQW structure, in addition to degradation in the electron confinement function in the quantum well.

For example, in the MQW structure, carriers additionally injected into a quantum well, which is already sufficiently filled with carriers, need to be transferred to the next quantum well. However, bending of a band-gap due to an increase in current density may cause the quantum barrier to be excessively high, which results in degradation of the carrier transfer efficiency.

SUMMARY

The embodiment provides a light-emitting device capable of increasing carrier transfer efficiency and thus improving optical efficiency, a method of fabricating the light-emitting device, a light-emitting device package, and a lighting system.

In addition, the embodiment provides a light-emitting device including a quantum well capable of increasing carrier confinement efficiency and thus improving optical efficiency, a method of fabricating the light-emitting device, a light-emitting device package, and a lighting system.

According to the embodiment, there is provided a light-emitting device including a first-conductivity-type semiconductor layer, an active layer disposed on the first-conductivity-type semiconductor layer and including a quantum well having a composition of $In_xGa_{1-x}N$ ($0<x<1$) and a quantum barrier having a composition of $In_yGa_{1-y}N$ ($0 \leq y < 1$), and a second-conductivity-type semiconductor layer disposed on the active layer. The active layer includes a first quantum well disposed on the first-conductivity-type semiconductor layer, a first quantum barrier disposed on the first quantum well, a second quantum well disposed on the first quantum barrier, and a second quantum barrier disposed on the second quantum well. A concentration of indium (In) in the first quantum barrier gradually increases toward the second quantum well, and the maximum concentration of indium (In) in the first quantum barrier is lower than a concentration of indium (In) in the second quantum well.

According to the embodiment, there is provided a light-emitting device including a first-conductivity-type semiconductor layer, an active layer disposed on the first-conductivity-type semiconductor layer and including a quantum well having a composition of $In_xGa_{1-x}N$ ($0<x<1$) and a quantum barrier having a composition of $In_yGa_{1-y}N$ ($0 \leq y < 1$), and a second-conductivity-type semiconductor layer disposed on the active layer. The active layer includes a first quantum well disposed on the first-conductivity-type semiconductor layer, a first quantum barrier disposed on the first quantum well, a second quantum well disposed on the first quantum barrier, and a second quantum barrier disposed on the second quantum well. A first effective barrier height between the first quantum well and the first quantum barrier is greater than a second effective barrier height between the first quantum barrier and the second quantum well.

According to the embodiment, a light-emitting device capable of increasing carrier transfer efficiency and thus improving optical efficiency, a method of fabricating the light-emitting device, a light-emitting device package, and a lighting system may be provided.

In addition, according to the embodiment, a light-emitting device including a quantum well capable of increasing carrier confinement efficiency and thus improving optical efficiency, a method of fabricating the light-emitting device, a light-emitting device package, and a lighting system may be provided.

DETAILED DESCRIPTION OF THE EMBODIMENTS

Hereinafter, a light-emitting device, a method of manufacturing the same, a light-emitting device package, and a lighting system according to the embodiment will be described with reference to the accompanying drawings.

In the description of embodiments, it will be understood that when a layer (or film) is referred to as being 'on' another layer or substrate, it can be directly on the other layer or substrate, or intervening layers may also be present. Further, it will be understood that when a layer is referred to as being 'under' another layer, it can be directly under the other layer, or one or more intervening layers may also be present. In addition, it will also be understood that when a layer is referred to as being 'between' two layers, it can be the only layer between the two layers, or one or more intervening layers may also be present.

(Embodiment)

Figure 1:
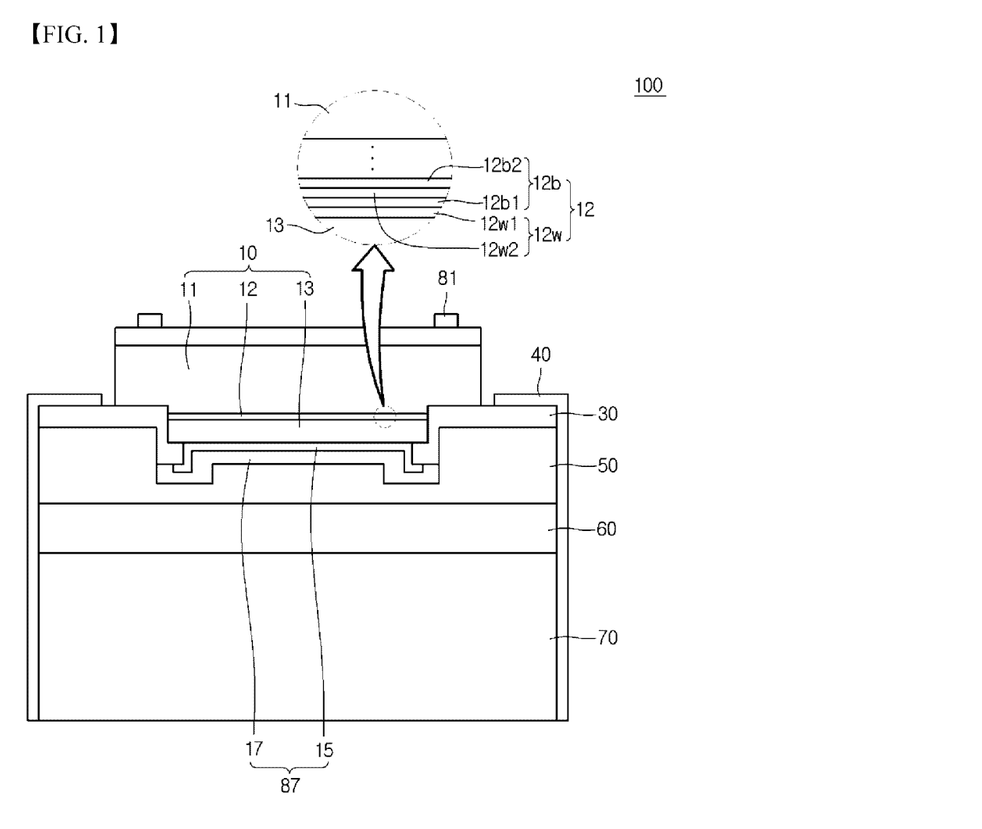
FIG. 1 is a cross-sectional view illustrating a semiconductor device according to the embodiment.

FIG. 1 is a cross-sectional view illustrating a semiconductor device 100 according to the embodiment.

The semiconductor device 100 according to the embodiment may include a first-conductivity-type semiconductor layer 11, an active layer 12 disposed on the first-conductivity-type semiconductor layer 11 and including a quantum well 12$w$ having a composition of $In_xGa_{1-x}N$ (0<x<1) and a quantum barrier 12$b$ having a composition of $In_yGa_{1-y}N$ (0≤y<1), and a second-conductivity-type semiconductor layer 13 disposed on the active layer 12.

In addition, the active layer 12 may include a plurality of quantum wells and quantum barriers. For example, the active layer 12 may include a first quantum well 12$w$1 disposed on the first-conductivity-type semiconductor layer 11, a first quantum barrier 12$b$1 disposed on the first quantum well 12$w$1, a second quantum well 12$w$2 disposed on the first quantum barrier 12$b$1, and a second quantum barrier 12$b$2 disposed on the second quantum well 12$w$2.

In the embodiment, a light-emitting device in which optical efficiency is improved by increasing carrier transfer efficiency, a method of fabricating the light-emitting device, a light-emitting device package, and a lighting system are provided.

In addition, according to the embodiment, a light-emitting device in which optical efficiency is improved by increasing carrier confinement efficiency, a method of fabricating the light-emitting device, a light-emitting device package, and a lighting system are provided.

Figure 2A:
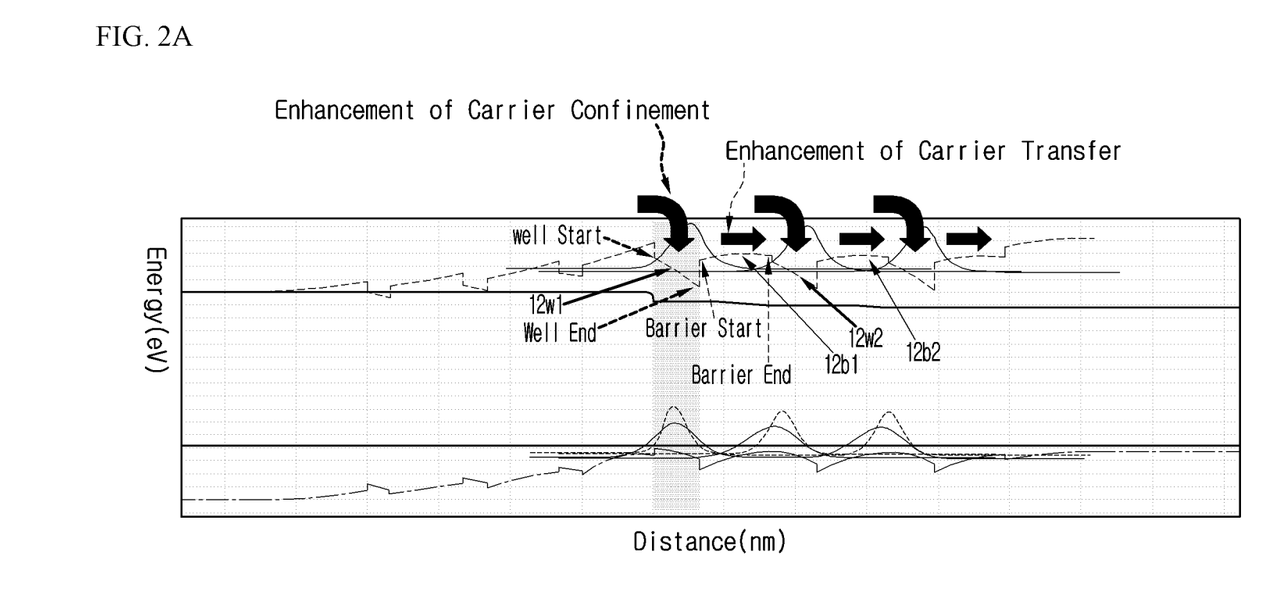
FIG. 2A is a band-gap diagram of a light-emitting device according to the embodiment.

FIG. 2 is a band-gap diagram of a light-emitting device according to the embodiment.

An electron overflow phenomenon occurring in a quantum well having a low potential barrier may cause reduction of the number of photons (hv) generated in a plurality of quantum wells MQW.

According to the embodiment, in order to solve the electron overflow phenomenon, an enhanced quantum confinement band-gap (EQCB) structure may be implemented.

In order to implement the EQCB structure according to the embodiment, the quantum well and the quantum barrier, that is, actual light-emitting layers, have an important role. Carriers injected into the quantum well may reinforce the carrier confinement function or reinforce the carrier transfer function depending on an effective barrier height between the quantum well and the quantum barrier, which results in an increase in the number of excited photons (hv). Accordingly, emission intensity and internal quantum efficiency (IQE) appearing in a wave/energy spectrum may be increased.

Figure 2B:
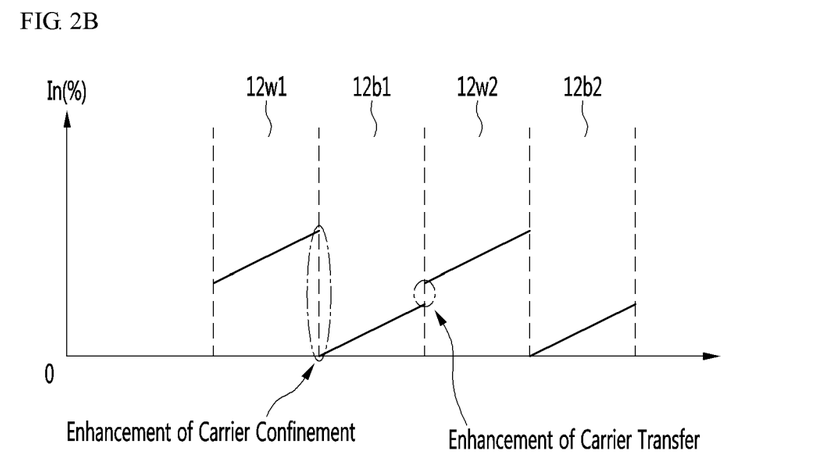
FIG. 2B is a graph of percentage of Indium across the quantum barrier and quantum well layers.

In this regard, according to the embodiment, variable band-gap energy may be formed by gradually increasing a concentration of indium (In) in the quantum well 12$w$, or band-gap energy may be changed by gradually increasing a concentration of indium (In) in the quantum barrier 12$b$ from 0%.

For example, according to the embodiment, a concentration of indium (In) in the first quantum barrier 12$b$1 may gradually increase toward the second quantum well 12$w$2 from 0%, and the maximum concentration of indium (In) in the first quantum barrier 12$b$1 may be lower than a concentration of indium (In) in the second quantum well 12$w$2.

In addition, a concentration of indium (In) in the first quantum well 12$w$1 may gradually increase toward the first quantum barrier 12$b$1 and may be higher than the concentration of indium (In) in the first quantum barrier 12$b$1. Further, the maximum concentration of indium (In) in the first quantum well 12$w$1 may be twice the minimum concentration of the first quantum well 12$w$1 or less.

According to the embodiment, electrons may optimally control a difference in band-gap energy between the quantum well and the quantum barrier in an epitaxial layer to generate a potential barrier in a boundary between the quantum well and the quantum barrier. As a result, the carrier confinement of injected electrons may be enhanced, and thus a carrier presence probability may be increased. In addition, since radiative recombination is promoted, the light-emitting efficiency may be improved.

Figure 3:
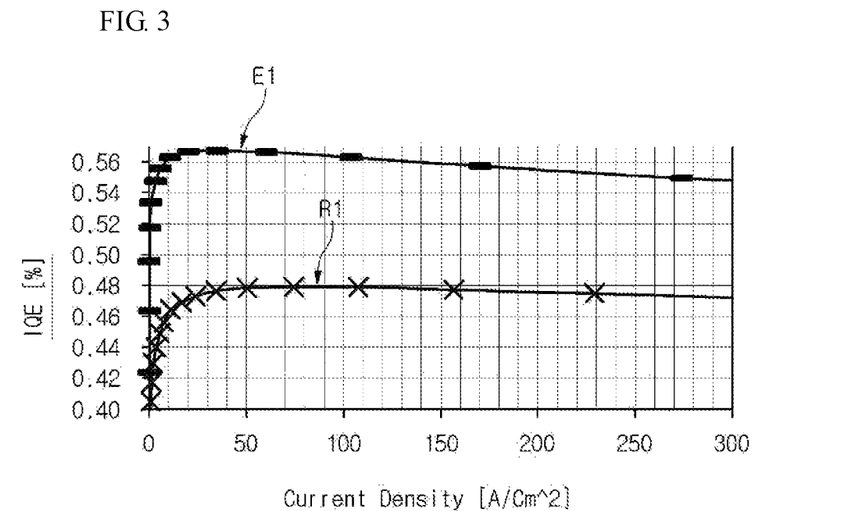
FIG. 3 is a first exemplary view illustrating internal quantum efficiency of a light-emitting device according to the embodiment.

FIG. 3 is a first exemplary view illustrating IQE of a light-emitting device according to the embodiment.

According to the embodiment, when a high potential barrier is formed between the quantum well and quantum barrier by controlling an effective barrier height between the quantum well and the quantum barrier to be sufficiently large, the carrier confinement function of injected electrons may be enhanced.

In particular, the confinement of carriers injected into each quantum well may be important at a low current density. In this regard, in an electron injection path, the concentration of indium (In) in the first quantum well 12$w$1 may increase toward the first quantum barrier 12$b$1 and may be higher than the concentration of indium (In) in the first quantum barrier 12$b$1. In addition, the maximum concentration of indium (In) in the first quantum well 12w1 may be twice the minimum concentration of the first quantum well 12w1 or less.

Figure 2C:
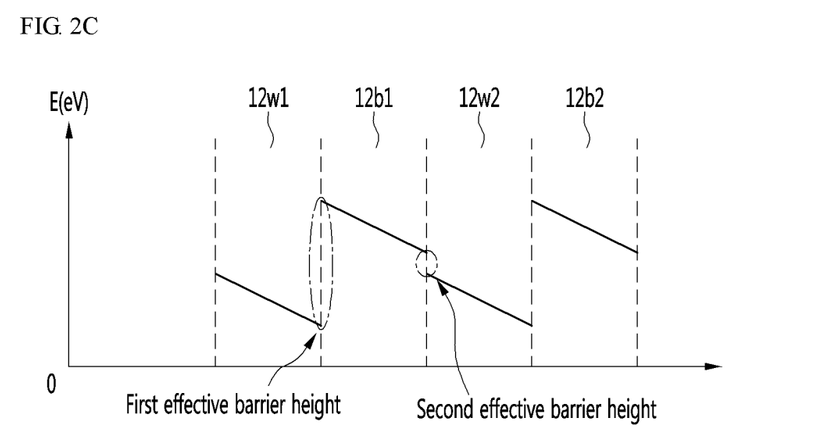
FIG. 2C is a graph of effective barrier height across the quantum barrier and quantum well layers.

Here, by controlling a first effective barrier height between the first quantum well 12w1 and the first quantum barrier 12b1 (that is, a well-end and barrier-start point) to be about 300 meV or more, the carrier confinement may be enhanced and thereby optical efficiency may be improved in the light-emitting device according to the embodiment.

Accordingly, as illustrated in FIG. 3, the IQE of the light-emitting device according to the embodiment (E1) is significantly increased compared to the IQE of the comparative example (R1), at a low current density.

Figure 4:
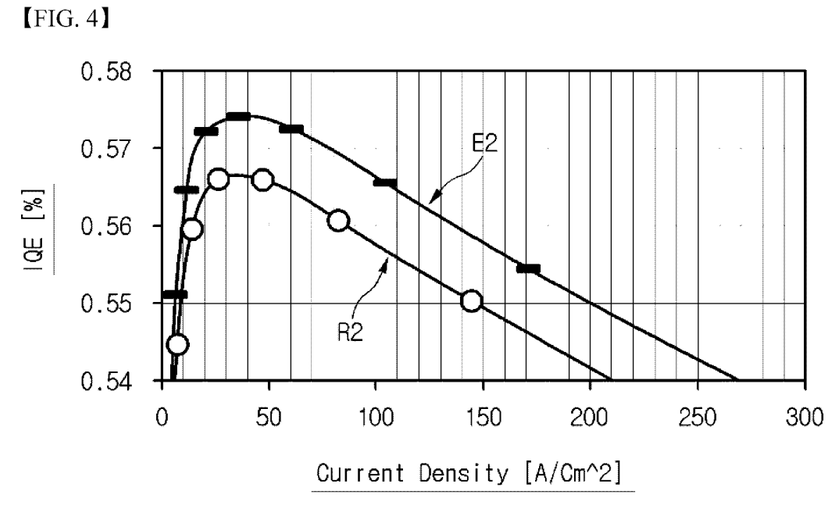
FIG. 4 is a second exemplary view illustrating internal quantum efficiency of a light-emitting device according to the embodiment.

FIG. 4 is a second exemplary view illustrating IQE of a light-emitting device according to the embodiment.

Normally, there is an efficiency droop phenomenon in which quantum efficiency decreases as a current density increases in the IQE. One reason for such an efficiency droop phenomenon is low carrier transfer efficiency.

According to the embodiment, in order to increase carrier transfer efficiency in transferring carriers to the quantum well 12w even at a high current density to avoid the IQE droop phenomenon, a second effective barrier height for transferring carriers in a boundary between the first quantum barrier 12b1 and the second quantum well 12w2 (that is, a barrier-end and well-start point) may be minimized.

For example, the concentration of indium (In) in the first quantum barrier 12b1 in the embodiment may gradually increase toward the second quantum well 12w2 from 0%. Here, the maximum concentration of indium (In) in the first quantum barrier 12b1 may be 5% to 10%, and may be lower than the minimum concentration of indium (In) in the second quantum well 12w2. For example, when the concentration of indium (In) in the first quantum barrier 12b1 is 5%, the first quantum barrier 12b1 may be $In_{0.05}Ga_{0.95}N$, but is not limited thereto.

Therefore, according to the embodiment, a second effective barrier height for transferring carriers at the barrier-end and well-start point may be controlled to be minimized (about 100 meV or less) by changing the concentration of indium (In) in the quantum barrier, and thereby the carrier transfer barrier may be removed by applying an electric field at the same level as the band-gap energy of the quantum barrier illustrated in FIG. 2 to the quantum barrier. Accordingly, the carrier transfer efficiency may be improved, and thus optical efficiency may be increased.

Accordingly, as illustrated in FIG. 4, the efficiency droop phenomenon occurring in a comparative example (R2) in which the carrier transfer efficiency is reduced due to bending of a band-gap at a high current density may be decreased in the embodiment (E2) by adopting an enhanced carrier transfer (ECT) structure.

Figure 5:
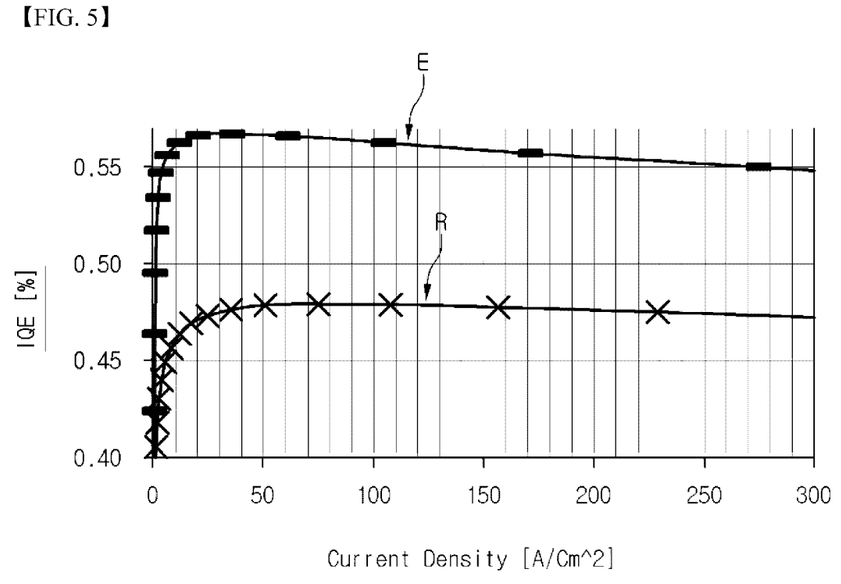
FIG. 5 is a third exemplary view illustrating internal quantum efficiency of a light-emitting device according to the embodiment.

FIG. 5 is a third exemplary view illustrating IQE of a light-emitting device according to the embodiment.

According to the embodiment (E), the carrier confinement efficiency may be significantly increased at a low current density, and the carrier transfer efficiency may be significantly increased at a high current density. Accordingly, the IQE may be greatly increased in the embodiment (E), compared to the IQE in the comparative example (R).

Hereinafter, a method of fabricating a light-emitting device according to the embodiment will be described with reference to FIGS. 6 to 8.

Figure 6:
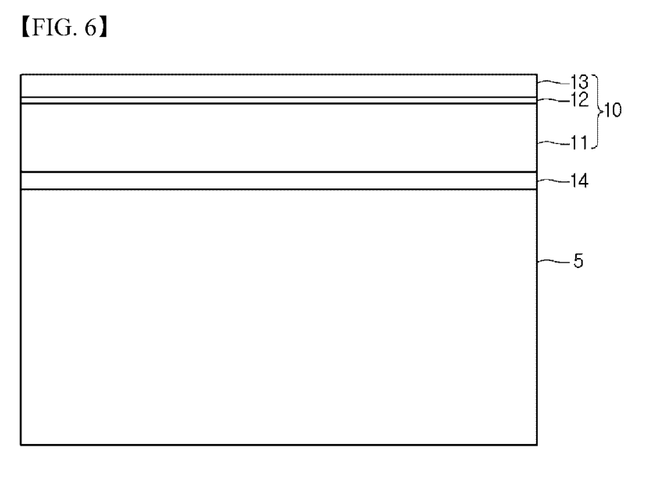
FIGS. 6 to 8 are cross-sectional views illustrating a method of fabricating a light-emitting device according to the embodiment.

In the method of fabricating the light-emitting device according to the embodiment, a first-conductivity-type semiconductor layer 11, an active layer 12, and a second-conductivity-type semiconductor layer 13 may be formed on a substrate 5, as illustrated in FIG. 6. The first-conductivity-type semiconductor layer 11, the active layer 12, and the second-conductivity-type semiconductor layer 13 may be defined as a light-emitting structure 10.

The substrate 5 may be formed of, for example, at least one of sapphire ($Al_2O_3$), SiC, GaAs, GaN, ZnO, Si, GaP, InP, or Ge, but is not limited thereto. The buffer layer (not shown) may further be formed between the first-conductivity-type semiconductor layer 11 and the substrate 5.

For example, the first-conductivity-type semiconductor layer 11 may be formed as an n-type semiconductor layer containing an n-type dopant as a first-conductivity-type dopant, and the second-conductivity-type semiconductor layer 13 may be formed as a p-type semiconductor layer containing a p-type dopant as a second-conductivity-type dopant. In addition, the first-conductivity-type semiconductor layer 11 may be formed as a p-type semiconductor layer, and the second-conductivity-type semiconductor layer 13 may be formed as an n-type semiconductor layer.

The first-conductivity-type semiconductor layer 11 may include, for example, an n-type semiconductor layer. The first-conductivity-type semiconductor layer 11 may be formed of a semiconductor material having a composition of $In_xAl_yGa_{1-x-y}N$ ($0 \leq x \leq 1$, $0 \leq y \leq 1$, and $0 \leq x+y \leq 1$). The first-conductivity-type semiconductor layer 11 may be, for example, selected from InAlGaN, GaN, AlGaN, AlInN, InGaN, AlN, and InN, and doped with an n-type dopant, such as Si, Ge, Sn, Se, or Te.

The active layer 12 may be a layer which emits light due to a difference in band-gap energy according to the materials forming the active layer 12 when electrons (or holes) injected into the first-conductivity-type semiconductor layer 11 combine with holes (or electrons) injected into the second-conductivity-type semiconductor layer 13.

The second-conductivity-type semiconductor layer 13 may be implemented as a p-type semiconductor layer, for example. The second-conductivity-type semiconductor layer 13 may be formed of a semiconductor material having a composition of $In_xAl_yGa_{1-x-y}N$ ($0 \leq x \leq 1$, $0 \leq y \leq 1$, and $0 \leq x+y \leq 1$). The second-conductivity-type semiconductor layer 13 may be selected from, for example, InAlGaN, GaN, AlGaN, InGaN, AlInN, AlN, and InN, and doped with a p-type dopant, such as Mg, Zn, Ca, Sr, or Ba.

Meanwhile, the first-conductivity-type semiconductor layer 11 may include the p-type semiconductor layer, and the second-conductivity-type semiconductor layer 13 may include the n-type semiconductor layer. In addition, a semiconductor layer including an n-type or p-type semiconductor layer may further be formed on the second-conductivity-type semiconductor layer 13. Accordingly, the light-emitting structure 10 may have a structure selected from n-p, p-n, n-p-n, and p-n-p junction structures. In addition, concentrations of impurities in the first-conductivity-type semiconductor layer 11 and the second-conductivity-type semiconductor layer 13 may be uniform or non-uniform. That is, the structure of the light-emitting structure 10 may be variously changed, and is not limited thereto.

In addition, a first-conductivity-type InGaN/GaN super-lattice structure or an InGaN/InGaN super-lattice structure may be formed between the first-conductivity-type semiconductor layer 11 and the active layer 12. In addition, a second-conductivity-type AlGaN layer may be formed between the second-conductivity-type semiconductor layer 13 and the active layer 12.

The light-emitting device according to the embodiment will be described in more detail with further reference to the band-gap diagram of the light-emitting device according to the embodiment illustrated in FIG. 2.

The active layer 12 according to the embodiment may include a quantum well 12w having a composition of $In_xGa_{1-x}N$ (0<x<1) and a quantum barrier 12b having a composition of $In_yGa_{1-y}N$ (0≤y<1), on the first-conductivity-type semiconductor layer 11.

In addition, the active layer 12 may include a plurality of quantum wells and quantum barriers. For example, the active layer 12 may include a first quantum well 12w1 on the first-conductivity-type semiconductor layer 11, a first quantum barrier 12b1 on the first quantum well 12w1, a second quantum well 12w2 on the first quantum barrier 12b1, and a second quantum barrier 12b2 on the second quantum well 12w2.

The electron overflow phenomenon occurring in a quantum well having a low potential barrier may reduce the number of photons (hv) generated in the plurality of quantum wells MQW.

According to the embodiment, the EQCB structure may be implemented to reduce the electron overflow phenomenon.

In order to implement the EQCB structure according to the embodiment, functions of the quantum well and the quantum barrier, that is, actual light-emitting layers, may be important. Carriers injected into the quantum well may reinforce the carrier confinement function or reinforce the carrier transfer function, depending on a first effective barrier height between the quantum well and the quantum barrier, which results in an increase in the number of excited photons (hv). Accordingly, an emission intensity and IQE appearing in wave/energy spectrum may be increased.

In this regard, according to the embodiment, variable band-gap energy may be formed by gradually increasing a concentration of indium (In) in the quantum well 12w, or band-gap energy may be changed by gradually increasing a concentration of indium (In) in the quantum barrier 12b from 0%.

For example, according to the embodiment, a concentration of indium (In) in the first quantum barrier 12b1 may gradually increase toward the second quantum well 12w2 from 0%, and the maximum concentration of indium (In) in the first quantum barrier 12b1 may be lower than the concentration of indium (In) in the second quantum well 12w2.

In addition, a concentration of indium (In) in the first quantum well 12w1 may gradually increase toward the first quantum barrier 12b1 and may be higher than the concentration of indium (In) in the first quantum barrier 12b1. In addition, the maximum concentration of indium (In) in the first quantum well 12w1 may be twice the minimum concentration of the first quantum well 12w1 or less.

According to the embodiment, electrons may optimally control a difference in band-gap energy between the quantum well and the quantum barrier in an epitaxial layer to generate a potential barrier in a boundary between the quantum well and the quantum barrier. As a result, the carrier confinement of injected electrons may be enhanced, and thus a carrier presence probability may be increased. In addition, since radiative recombination is promoted, the light-emitting efficiency may be improved.

According to the embodiment, when a high potential barrier is formed between the quantum well and quantum barrier by controlling a second effective barrier height between the quantum well and the quantum barrier to be sufficiently large, the carrier confinement function of injected electrons may be enhanced.

In particular, the confinement of carriers injected into each quantum well may be important at a low current density. In this regard, in an electron injection path, the concentration of indium (In) in the first quantum well 12w1 may increase toward the first quantum barrier 12b1 and may be higher than the concentration of indium (In) in the first quantum barrier 12b1. In addition, the maximum concentration of indium (In) in the first quantum well 12w1 may be twice the minimum concentration of the first quantum well 12w1 or less.

Here, the concentration of indium (In) in the first quantum barrier 12b1 in the embodiment may gradually increase toward the second quantum well 12w2 from 0%. The maximum concentration of indium (In) in the first quantum barrier 12b1 may be 5% to 10%, and may be lower than the concentration of indium (In) in the second quantum well 12w2.

In this manner, by controlling the first effective barrier height between the first quantum well 12w1 and the first quantum barrier 12b1 (that is, the well-end and barrier-start point) to be about 300 meV or more, the carrier confinement may be enhanced and thereby optical efficiency may be improved.

Accordingly, as illustrated in FIG. 3, the IQE of the light-emitting device according to the embodiment (E1) is significantly increased compared to the IQE of the comparative example (R1) at a low current density.

The efficiency droop phenomenon, in which quantum efficiency decreases as a current density increases, occurs in the IQE. One reason for such an efficiency droop phenomenon is low carrier transfer efficiency.

According to the embodiment, in order to increase efficiency of transferring carriers to the first quantum well 12w1 and the second quantum well 12w2 even at a high current density to avoid the IQE droop phenomenon, an effective barrier height for carrier transfer in a boundary between the first quantum barrier 12b1 and the second quantum well 12w2 (that is the barrier-end and well-start point) may be minimized.

For example, the concentration of indium (In) in the first quantum barrier 12b1 in the embodiment may gradually increase toward the second quantum well 12w2 from 0%, and the maximum concentration of indium (In) in the first quantum barrier 12b1 may be 5% to 10%, lower than the minimum concentration of indium (In) in the second quantum well 12w2.

In this manner, according to the embodiment, the effective barrier height for carrier transfer at the barrier-end and well-start point may be controlled to be minimized (about 100 meV or less) by changing the concentration of indium (In) in the quantum barrier, and thereby the carrier transfer barrier may be removed by applying an electric field at the same level as the band-gap energy of the quantum barrier illustrated in FIG. 2, to the quantum barrier. Accordingly, the carrier transfer efficiency may be improved, and thus optical efficiency may be increased.

Accordingly, as illustrated in FIG. 4, the efficiency droop phenomenon occurring in a comparative example (R2) in which the carrier transfer efficiency is reduced due to bending of a band-gap at a high current density may be decreased in the embodiment (E2) by adopting an enhanced carrier transfer (ECT) structure.

According to the embodiment (E), the carrier confinement efficiency may be significantly increased at a low current density, and the carrier transfer efficiency may be significantly increased at a high current density. Accordingly, the IQE may be greatly increased in the embodiment (E), compared to the IQE in the comparative example (R).

Figure 7:
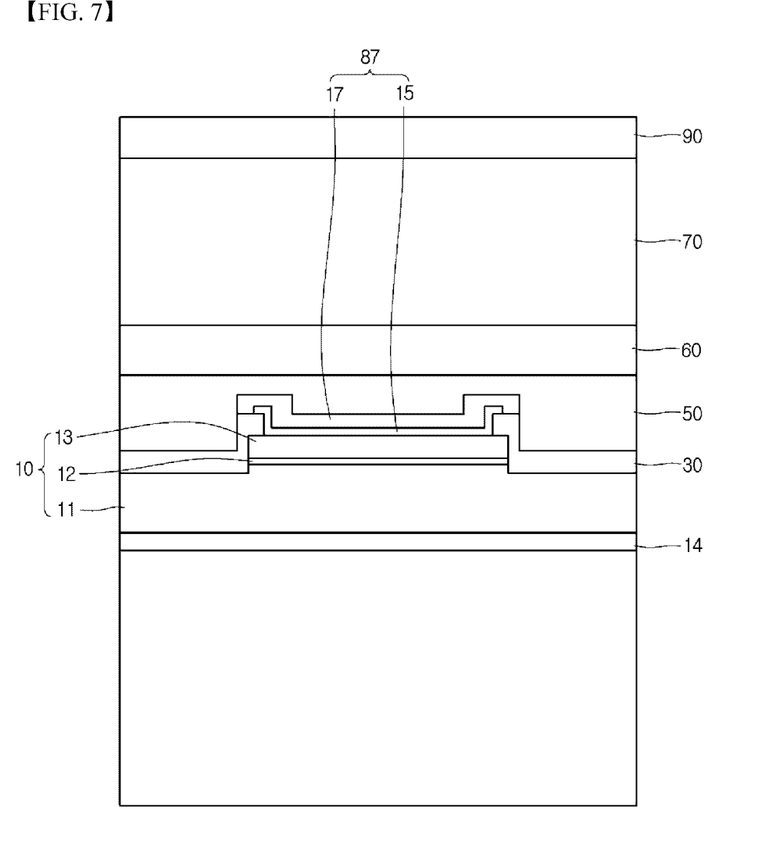

Next, as illustrated in FIG. 7, the first-conductivity-type semiconductor layer 11 may be partially exposed by etching the light-emitting structure 10. Here, the etching of the light-emitting structure 10 may be performed in a wet etching process or a dry etching process.

Next, a channel layer 30, an ohmic contact pattern 15, and a reflective layer 17 may be formed on the light-emitting structure 10.

For example, the channel layer 30 may be formed of at least one selected from the group consisting of $SiO_2$, $Si_xO_y$, $Si_3N_4$, $Si_xN_y$, $SiO_xN_y$, $Al_2O_3$, $TiO_2$, and AlN.

The ohmic contact pattern 15 may be disposed between the reflective layer 17 and the second-conductivity-type semiconductor layer 13. The ohmic contact pattern 15 may be in contact with the second-conductivity-type semiconductor layer 13.

The ohmic contact pattern 15 may form an ohmic contact with the light-emitting structure 10. The reflective layer 17 may be electrically connected to the second-conductivity-type semiconductor layer 13. The ohmic contact pattern 15 may include a portion forming an ohmic contact with the light-emitting structure 10.

The ohmic contact pattern 15 may be formed of, for example, a transparent conductive oxide. The ohmic contact pattern 15 may include, for example, at least one selected from the group consisting of indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), IZO nitride (IZON), ZnO, IrOx, RuOx, NiO, Pt, Ag, and Ti.

The reflective layer 17 may be formed of a material having high reflectivity. For example, the reflective layer 17 may be formed of a metal or an alloy including at least one selected from the group consisting of Ag, Ni, Al, Rh, Pd, Ir, Ru, Mg, Zn, Pt, Cu, Au, and Hf. In addition, the reflective layer 17 may be formed in multiple layers including the metal or alloy and the transparent conductive material, such as ITO, IZO, IZTO, IAZO, IGZO, IGTO, AZO, or ATO. For example, the reflective layer 17 according to the embodiment may include at least one of Ag, Al, a Ag—Pd—Cu alloy, and a Ag—Cu alloy.

For example, the reflective layer 17 may be multiple layers in which a Ag layer and a Ni layer are alternately stacked, or may include a Ni/Ag/Ni layer, a Ti layer, or a Pt layer. In addition, the ohmic contact pattern 15 may be formed under the reflective layer 17, and at least a portion thereof may pass through the reflective layer 17 to form an ohmic contact with the light-emitting structure 10.

Next, a metal layer 50, a bonding layer 60, a supporting material 70, and a temporary substrate 90 may be formed on the reflective layer 17.

The metal layer 50 may include at least one of Au, Cu, Ni, Ti, Ti—W, Cr, W, Pt, V, Fe, and Mo. The metal layer 50 may function as a diffusion barrier layer.

According to the embodiment, a first electrode layer 87 electrically connected to the second-conductivity-type semiconductor layer 13 may include at least one of a reflective layer, an ohmic contact layer, and a metal layer. According to the embodiment, the first electrode layer 87 may include all of the reflective layer, the ohmic contact layer, and the metal layer, or one or two thereof.

The metal layer 50 may function to prevent a material included in the bonding layer 60 from being diffused toward the reflective layer 17 during a process of forming the bonding layer 60. The second metal layer 50 may function to prevent a material included in the bonding layer 60, such as tin (Sn), from affecting the reflective layer 17.

The bonding layer 60 may include a barrier metal or a bonding metal, such as at least one of Ti, Au, Sn, Ni, Cr, Ga, In, Bi, Cu, Ag, Nb, Pd, and Ta. The supporting material 70 may support the light-emitting structure 10 according to the embodiment, and may perform a heat-dissipating function. The bonding layer 60 may be implemented as a seed layer.

The supporting material 70 may be formed of, for example, at least one of Ti, Cr, Ni, Al, Pt, Au, W, Cu, Mo, Cu—W, and a semiconductor substrate (e.g. Si, Ge, GaN, GaAs, ZnO, SiC, or SiGe) including impurities. Alternatively, the supporting material 70 may be formed of an insulating material.

The temporary substrate 90 may be formed on the supporting material 70. The temporary substrate 90 may include at least one of a metal material, a semiconductor material, and an insulating material.

Figure 8:
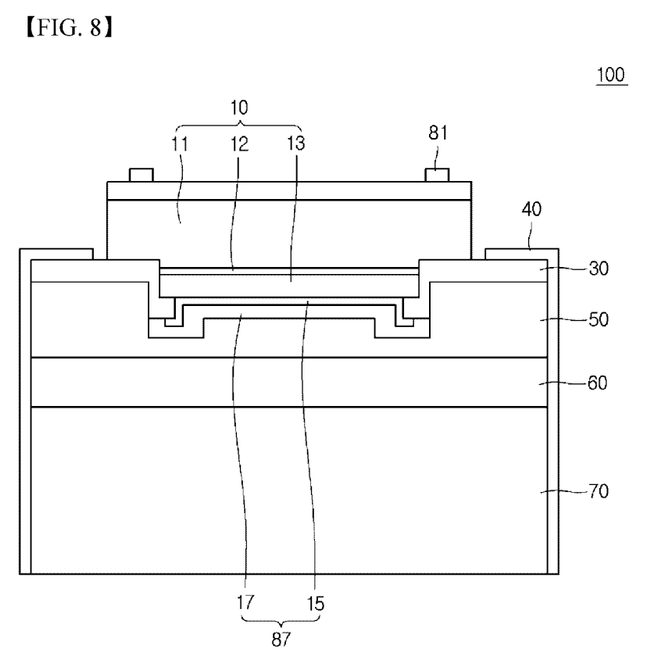

Next, the substrate 5 may be removed from the light-emitting structure 10, as illustrated in FIG. 8. For example, the substrate 5 may be removed by a laser lift off (LLO) process. The LLO process is a process of separating the substrate 5 and the light-emitting structure 10 by irradiating a lower surface of the substrate 5 with a laser.

In addition, an isolation-etching process, a process of forming a pad electrode 81, a scribing process, a process of forming a reflector 40, and a process of removing the temporary substrate 90 may be performed. Such processes are merely examples, and the process sequence may be variously modified as needed.

According to the embodiment, in the isolation etching process, side surfaces of the light-emitting structure 10 may be etched and the channel layer 30 may be partially exposed. The isolation etching process may be, for example, a dry etching process such as an inductively coupled plasma (ICP) etching process, but is not limited thereto.

Roughness (not shown) may be formed in an upper surface of the light-emitting structure 10. A light-extracting pattern may be formed on the upper surface of the light-emitting structure 10. A textured pattern may be formed on the upper surface of the light-emitting structure 10. The light-extracting pattern of the light-emitting structure 10 may be formed in a photo electro chemical (PEC) etching process, for example. Accordingly, an external light-extracting effect of the light-emitting device according to the embodiment may be increased.

Next, the pad electrode 81 may be formed on the light-emitting structure 10.

The pad electrode 81 may be electrically connected to the first-conductivity-type semiconductor layer 11. A portion of the pad electrode 81 may be in contact with the first-conductivity-type semiconductor layer 11. According to the embodiment, power may be applied to the light-emitting structure 10 via the pad electrode 81 and the first electrode layer 87.

The pad electrode 81 may include an ohmic layer, an intermediate layer, and a top layer. The ohmic layer may include a material selected from Cr, V, W, Ti, and Zn to implement an ohmic contact. The intermediate, layer may be formed of a material selected from Ni, Cu, and Al. The top layer may include, for example, Au. The pad electrode 81 may include at least one selected from Cr, V, W, Ti, Zn, Ni, Cu, Al, and Au.

In addition, a scribing process may be performed to expose side surfaces of the channel layer 30 and the supporting material 70. The reflector 40 may be formed on the side surfaces of the channel layer 30 and the supporting material 70. Next, the temporary substrate 90 may be removed to form an individual light-emitting device.

According to the embodiment, the reflector 40 may be formed on the channel layer 30. The reflector 40 may be disposed in contact with the channel layer 30. The reflector 40 may be formed on the side surface of the supporting material 70. The reflector 40 may be disposed in contact with the supporting material 70. According to the embodiment, the reflector 40 may include a first region disposed on the channel layer 30 and a second region disposed on the side surface of the supporting material 70, which are connected to each other.

In addition, the reflector 40 may be formed on a side surface of the metal layer 50. The reflector 40 may be in contact with the side surface of the metal layer 50. The reflector 40 may be disposed on a side surface of the bonding layer 60. The reflector 40 may be in contact with the side surface of the bonding layer 60. The reflector 40 may be disposed apart from the light-emitting structure 10. The reflector 40 may be electrically isolated from the light-emitting structure 10.

The reflector 40 may be formed of a material having high reflectivity. For example, the reflector 40 may include at least one of Ag, Al, and Pt. The reflector 40 may be formed to a thickness of 50 to 5000 nanometers, for example.

The reflector 40 may serve to prevent light emitted from the light-emitting structure 10 from being incident on and absorbed into the channel layer 30, the metal layer 50, the bonding layer 60, and the supporting material 70. That is, the reflector 40 may reflect light incident from the outside and thereby prevent light from being absorbed into the channel layer 30, the metal layer 50, the bonding layer 60, and the supporting material 70.

Due to the reflector 40, even when the roughness is formed on one of the side surface of the channel layer 30, the side surface of the metal layer 50, the side surface of the bonding layer 60, and the side surface of the supporting material 70, the side surfaces of the light-emitting device according to the embodiment may be implemented to be flat. That is, since the surface of the reflector 40 is formed flat, the side surfaces of the light-emitting device according to the embodiment may be implemented to be fully flat, even when the roughness is formed on one of the side surface of the channel layer 30, the side surface of the metal layer 50, the side surface of the bonding layer 60, and the side surface of the supporting material 70 in the scribing process or the like.

Figure 9:
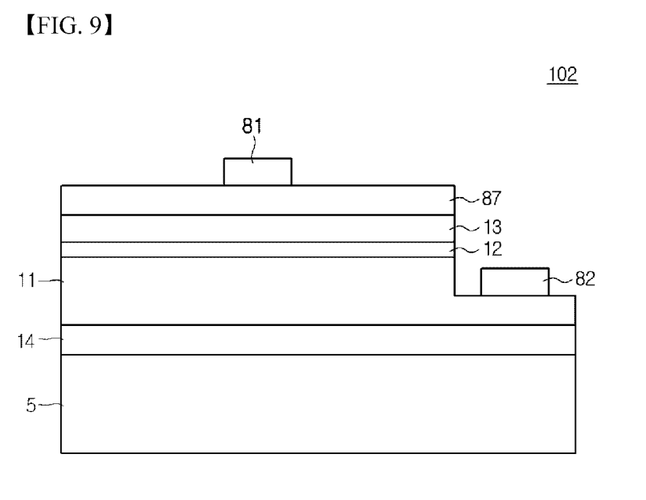
FIG. 9 is a cross-sectional view of a light-emitting device according to another embodiment.

FIG. 9 is a cross-sectional view illustrating a light-emitting device 102 according to another embodiment.

The above-described technical features may be employed in the light-emitting device 102 according to the embodiment.

The light-emitting device 102 according to the embodiment may be a horizontal light-emitting device, and may include a substrate 5, a first-conductivity-type semiconductor layer 11 disposed on the substrate 5, an active layer 12 disposed on the first-conductivity-type semiconductor layer 11, and a second-conductivity-type semiconductor layer 13 disposed on the active layer 12.

The light-emitting device 102 according to the embodiment may have a structure of a horizontal chip, a first electrode layer 87 may be disposed on the second-conductivity-type semiconductor layer 13, and the first electrode layer 87 may include a transparent ohmic layer.

A first pad electrode 81 and a second pad electrode 82 may be respectively disposed on a second electrode layer 87 and an exposed first-conductivity-type semiconductor layer 11, and a buffer layer 14 may be disposed on the substrate 5.

Figure 10:
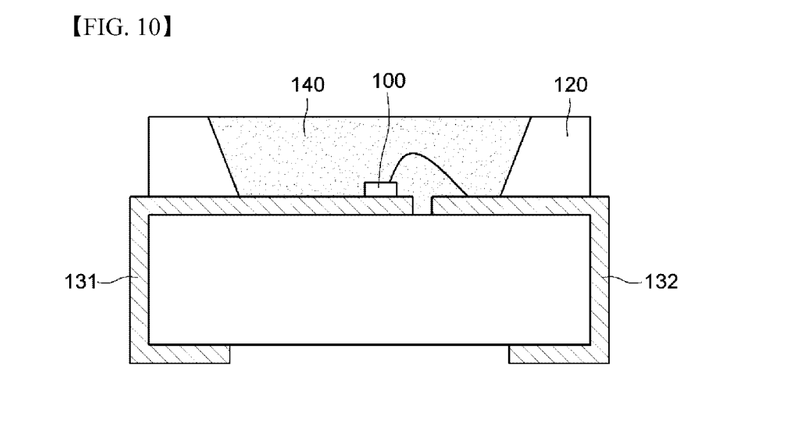
FIG. 10 is a cross-sectional view of a light-emitting device package according to the embodiment.

FIG. 10 illustrates a light-emitting device package including a light-emitting device according to the embodiment.

Referring to FIG. 10, the light-emitting device package according to the embodiment may include a body 120, a first lead electrode 131 and a second lead electrode 132 disposed on the body 120, a semiconductor device 100 according to the embodiment provided on the body 120 and electrically connected to the first lead electrode 131 and the second lead electrode 132, and a molding material 140 configured to surround the semiconductor device 100.

The body 120 may include silicon, a synthetic resin, or a metal, and an inclined surface may be formed around the semiconductor device 100.

The first lead electrode 131 and the second lead electrode 132 may be electrically isolated from each other, and may provide power to the semiconductor device 100. In addition, the first lead electrode 131 and the second lead electrode 132 may increase optical efficiency by reflecting light generated in the semiconductor device 100, and may function to discharge heat generated in the semiconductor device 100.

The semiconductor device 100 may be disposed on the body 120, the first lead electrode 131, or the second lead electrode 132.

The semiconductor device 100 may be electrically connected to the first lead electrode 131 and the second lead electrode 132 by a wiring method, a flip-chip method, or a die bonding method.

The molding material 140 may surround the semiconductor device 100 to protect the semiconductor device 100. In addition, the molding material 140 may include a fluorescent material to change a wavelength of light emitted from the semiconductor device 100.

One or a plurality of light-emitting devices or light-emitting device packages according to the embodiment may be arranged on a board, and an optical element, such as a lens, a light guide plate, a prism sheet, or a diffusion sheet, may be disposed on a light path of the light-emitting device package. Such a light-emitting device package, board, or optical element may function as a light unit. The light unit may be implemented in a top-view type or a side-view type, to be supplied to a display device of a portable terminal, a laptop computer, or the like, or to be applied to a lighting system, an indicating apparatus, or the like. In another embodiment, a lighting system including the light-emitting device or the light-emitting device package in the above-described embodiment may be implemented. For example, the lighting system may include a lamp, a street light, an electronic board, or a headlight.

Figure 11:
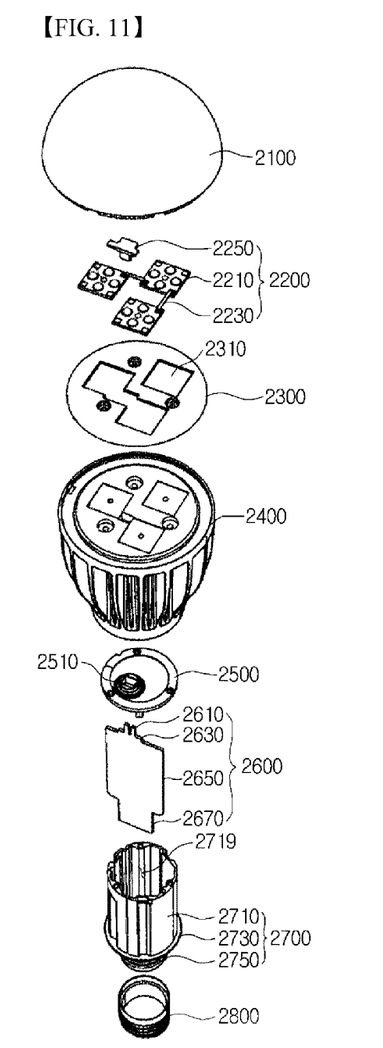
FIG. 11 is an exploded perspective view illustrating a lighting system according to the embodiment.

FIG. 11 is an exploded perspective view illustrating a lighting system according to the embodiment.

Referring to FIG. 11, a lighting system according to the embodiment may include a cover 2100, a light source module 2200, a heat dissipater 2400, a power supply 2600, an inner case 2700, and a socket 2800. In addition, the lighting system according to the embodiment may include at least one of a member 2300 and a holder 2500. The light source module 2200 may include the light-emitting device package according to the embodiment.

For example, the cover 2100 may have a bulbous or a hemispherical shape, and may have a hollow structure. In addition, a portion of the cover 2100 may be open. The cover 2100 may be optically connected to the light source module 2200. For example, the cover 2100 may allow light emitted from the light source module 2200 to be diffused, scattered, and excited. The cover 2100 may be a kind of optical element. The cover 2100 may be coupled with the heat dissipater 2400. The cover 2100 may include a connector coupled with the heat dissipater 2400.

An inner surface of the cover 2100 may be coated with an ivory white coating material. The ivory white coating material may include a diffusion material. A surface roughness of the inner surface of the cover 2100 may be greater than a surface roughness of an outer surface of the cover 2100 so that the light emitted from the light source module 2200 is sufficiently scattered and diffused to be emitted to the outside.

The cover 2100 may be formed of glass, plastic, polypropylene (PP), polyethylene (PE), polycarbonate (PC), or the like. Here, PC has excellent light resistance, heat resistance, and strength. The cover 2100 may be transparent so that the light source module 2200 is visible at the outside, or opaque. The cover 2100 may be formed by a blow molding method.

The light source module 2200 may be disposed on a surface of the heat dissipater 2400. Accordingly, heat generated from the light source module 2200 may be conducted to the heat dissipater 2400. The light source module 2200 may include a light source 2210, a connection plate 2230, and a connector 2250.

The member 2300 may be disposed on an upper surface of the heat dissipater 2400, and include guide grooves 2310 allowing a plurality of light sources 2210 and the connector 2250 to be inserted therein. The guide grooves 2310 may correspond to a surface of the light source 2210 and a connector 2250.

A surface of the member 2300 may be covered or coated with a light-reflective material. For example, the surface of the member 2300 may be covered or coated with a white coating material. The member 2300 may reflect light that is reflected from the inner surface of the cover 2100 and returns toward the light source module 2200 back to the cover 2100. Accordingly, optical efficiency of the lighting system according to the embodiment may be improved.

The member 2300 may be formed of, for example, an insulating material. The connection plate 2230 of the light source module 2200 may include an electrically conductive material. Accordingly, the heat dissipater 2400 may form electrical connection with the connection plate 2230. The member 2300 may be formed of an insulating material to prevent an electrical short circuit between the connection plate 2230 and the heat dissipater 2400. The heat dissipater 2400 may receive heat generated from the light source module 2200 and heat generated from the power supply 2600, and may dissipate the heat.

The holder 2500 may block an accommodation groove 2719 of an insulating part 2710 of an inner case 2700. Accordingly, the power supply 2600 accommodated in the insulating part 2710 of the inner case 2700 may be encapsulated. The holder 2500 may include a guide protrusion 2510. The guide protrusion 2510 may include a hole through which a protrusion 2610 of the power supply 2600 passes.

The power supply 2600 may process or convert an electrical signal supplied from an external device and supply the processed or converted electrical signal to the light source module 2200. The power supply 2600 may be accommodated in the accommodation groove 2719 of the inner case 2700, and encapsulated in the inner case 2700 by the holder 2500.

The power supply 2600 may include a protrusion 2610, a guide 2630, a base 2650, and an extension 2670.

The guide 2630 may have a shape outwardly protruding from one side of the base 2650. The guide 2630 may be inserted into the holder 2500. A plurality of components may be disposed on a surface of the base 2650. The plurality of components may include, for example, a DC converter provided to convert AC power provided from an external power source to DC power, a driving chip provided to drive the light source module 2200, and an electrostatic discharge (ESD) protection device, but is not limited thereto.

The extension 2670 may have a shape outwardly protruding from the other side of the base 2650. The extension 2670 may be inserted into a connector 2750 of the inner case 2700, and may receive an electrical signal from the external device. For example, the extension 2670 may have the same width or a smaller width than the connector 2750 of the inner case 2700. One terminal of a "+ cable" and a "− cable" may be electrically connected to the extension 2670 and the other terminal of the "+ cable" and the "− cable" may be electrically connected to the socket 2800.

The inner case 2700 may include the power supply 2600 and a molding part thereinside. The molding part is a portion in which a molding liquid is hardened, and serves to fix the power supply 2600 to the inside of the inner case 2700.

The light-emitting device, the method of fabricating the light-emitting device, the light-emitting device package, and the lighting system according to the embodiment can increase carrier transfer efficiency and thus improve optical efficiency.

In addition, the quantum well according to the embodiment can increase carrier confinement efficiency and thus improve optical efficiency.

Any reference in this specification to "one embodiment," "the embodiment," "example embodiment," etc., means that a particular feature, structure, or characteristic described in connection with the embodiment is included in at least one embodiment of the invention. The appearance of such phrases in various places in the specification does not necessarily refer to the same embodiment every time. Further, when a particular feature, structure, or characteristic is described in connection with any embodiment, it is submitted that it is within the purview of one skilled in the art to affect such feature, structure, or characteristic in connection with other embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings, and the appended claims. In addition to variations and modifications in the component parts and/or arrangements, alternative uses will also be apparent to those skilled in the art.

What is claimed is:

1. A light-emitting device comprising:
  a light-emitting structure comprising:
    an n-type semiconductor layer;
    an active layer disposed on the n-type semiconductor layer and including a quantum well having a composition of $In_xGa_{1-x}N$ ($0<x<1$) and a quantum barrier having a composition of $In_yGa_{1-y}N$ ($0 \leq y<1$); and
    a p-type semiconductor layer disposed on the active layer, a recess formed on a bottom portion of the light emitting structure, the recess exposing the active layer, a channel layer directly contacting a bottom surface of the p-type semiconductor layer, a side surface of the active layer and a bottom surface of the n-type semiconductor layer;

a reflective layer directly contacting the channel layer and spaced apart from the light-emitting structure; and a reflector directly contacting a side surface and a top surface of the channel layer, wherein the active layer comprises:
  a first quantum well directly contacting the n-type semiconductor layer;
  a first quantum barrier disposed on the first quantum well;
  a second quantum well disposed on the first quantum barrier; and
  a second quantum barrier disposed on the second quantum well, wherein a concentration of indium (In) in the first quantum barrier gradually increases toward the second quantum well, and a maximum concentration of indium (In) in the first quantum barrier is lower than a concentration of indium (In) in the second quantum well, wherein a concentration of indium (In) in the first quantum well increases toward the first quantum barrier, and a minimum concentration of indium (In) in the first quantum well is greater than the concentration of indium (In) in the first quantum barrier, wherein a first effective barrier height between the first quantum well and the first quantum barrier is greater than a second effective barrier height between the first quantum barrier and the second quantum well, wherein a bottom surface of the active layer is formed by the first quantum well, wherein the first effective barrier height between an end point of the first quantum well and a start point of the first quantum barrier is about 300 meV or more, wherein the second effective barrier height between an end point of the first quantum barrier and a start point of the second quantum well is less than 100 meV, and wherein the maximum concentration of indium (In) in the first quantum barrier is in the range of 5% to 10% of a total amount of III-type material.

2. The light-emitting device of claim 1, wherein the maximum concentration of indium (In) in the first quantum well is twice the minimum concentration of indium (In) in the first quantum well or less.

3. The light-emitting device of claim 1, wherein the active layer comprises an enhanced quantum confinement bandgap (EQCB) structure.

4. The light-emitting device of claim 1, wherein the second quantum barrier forms a top surface of the active layer.

5. A light-emitting device, comprising:
  a light-emitting structure comprising:
    an n-type semiconductor layer;
    an active layer disposed on the n-type semiconductor layer and including a quantum well having a composition of $In_xGa_{1-x}N$ ($0<x<1$) and a quantum barrier having a composition of $In_yGa_{1-y}N$ ($0 \leq y<1$); and
    a p-type semiconductor layer disposed on the active layer;

a recess formed on a bottom portion of the light emitting structure, the recess exposing the active layer;

a channel layer directly contacting a bottom surface of the p-type semiconductor layer, a side surface of the active layer and a bottom surface of the n-type semiconductor layer, a width of the channel layer being greater than a width of the p-type semiconductor layer;

a reflective layer directly contacting the channel layer and spaced apart from the light-emitting structure; and a reflector directly contacting a side surface and a top surface of the channel layer, wherein the active layer comprises:
  a first quantum well directly contacting the n-type semiconductor layer;
  a first quantum barrier disposed on the first quantum well;
  a second quantum well disposed on the first quantum barrier; and
  a second quantum barrier disposed on the second quantum well, wherein a first effective barrier height between the first quantum well and the first quantum barrier is greater than a second effective barrier height between the first quantum barrier and the second quantum well, wherein a concentration of indium (In) in the first quantum barrier gradually increases toward the second quantum well, and a maximum concentration of indium (In) in the first quantum barrier is lower than a concentration of indium (In) in the second quantum well, wherein a concentration of indium (In) in the first quantum well increases toward the first quantum barrier, and a minimum concentration of indium (In) in the first quantum well is greater than a concentration of indium (In) in the first quantum barrier, wherein a bottom surface of the active layer is formed by the first quantum well, wherein the second effective barrier height between an end point of the first quantum barrier and a start point of the second quantum well is less than 100 meV, wherein the concentration of indium (In) in the first quantum barrier gradually increases toward the second quantum well from 0%, and wherein the maximum concentration of indium (In) in the first quantum barrier is in the range of 5% to 10% of a total amount of III-type material.

6. The light-emitting device of claim 5, wherein the first effective barrier height between an end point of the first quantum well and a start point of the first quantum barrier is about 300 meV or more.

7. The light-emitting device of claim 6, wherein the maximum concentration of indium (In) in the first quantum well is twice the minimum concentration of indium (In) in the first quantum well or less.

8. The light-emitting device of claim 5, wherein the second quantum barrier forms a top surface of the active layer.

* * * * *